(12) United States Patent
Niessner et al.

(10) Patent No.: US 10,607,911 B2
(45) Date of Patent: Mar. 31, 2020

(54) CHIP CARRIER LAMINATE WITH HIGH FREQUENCY DIELECTRIC AND THERMOMECHANICAL BUFFER

(71) Applicant: Infineon Technologies AG, Neubiberg (DE)

(72) Inventors: Martin Richard Niessner, Munich (DE); Walter Hartner, Bad Abbach-Peissing (DE); Gerhard Haubner, Regensburg (DE); Sebastian Pahlke, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 214 days.

(21) Appl. No.: 14/997,596

(22) Filed: Jan. 18, 2016

(65) Prior Publication Data

US 2016/0211189 A1 Jul. 21, 2016

(30) Foreign Application Priority Data

Jan. 20, 2015 (DE) .......................... 10 2015 100 771

(51) Int. Cl.
*H05K 7/00* (2006.01)
*H01L 23/31* (2006.01)
(Continued)

(52) U.S. Cl.
CPC .......... *H01L 23/3128* (2013.01); *H01L 21/52* (2013.01); *H01L 21/563* (2013.01); *H01L 23/145* (2013.01); *H01L 23/3185* (2013.01); *H01L 23/49822* (2013.01); *H01L 23/66* (2013.01); *H05K 1/0271* (2013.01); *H05K 1/181* (2013.01); *H01L 24/16* (2013.01); *H01L 24/20* (2013.01); *H01L 2223/6677* (2013.01); *H01L 2224/02379* (2013.01);
(Continued)

(58) Field of Classification Search
None
See application file for complete search history.

(56) References Cited

U.S. PATENT DOCUMENTS 8,143,108 B2  3/2012  Pendse
8,633,600 B2 * 1/2014  Mengel ................... H01L 24/27
                                                    257/782

(Continued)

FOREIGN PATENT DOCUMENTS

DE    38 51 553 T2    3/1989
DE    101 61 101 A1    3/2003
WO       0004577 A1    1/2000

*Primary Examiner* — Nguyen T Ha

(57) ABSTRACT

A chip carrier for carrying an encapsulated electronic chip, wherein the chip carrier comprises a laminate structure formed as a stack of a plurality of electrically insulating structures and a plurality of electrically conductive structures, and a chip coupling area at an exposed surface of the laminate structure being configured for electrically and mechanically coupling the encapsulated electronic chip, wherein one of the electrically insulating structures is configured as high frequency dielectric made of a material being compatible with low-loss transmission of a high-frequency signal, and wherein at least one of another one of the electrically insulating structures and one of the electrically conductive structures is configured as a thermomechanical buffer for buffering thermally induced mechanical load.

18 Claims, 7 Drawing Sheets

(51) Int. Cl.
*H01L 21/56* (2006.01)
*H01L 21/52* (2006.01)
*H05K 1/02* (2006.01)
*H05K 1/18* (2006.01)
*H01L 23/14* (2006.01)
*H01L 23/498* (2006.01)
*H01L 23/66* (2006.01)
*H01L 23/00* (2006.01)

(52) U.S. Cl.
CPC ............... *H01L 2224/12105* (2013.01); *H01L 2224/16227* (2013.01); *H01L 2924/18161* (2013.01); *H01L 2924/18162* (2013.01); *H01L 2924/3511* (2013.01)

(56) References Cited

U.S. PATENT DOCUMENTS

| | | | |
|---|---|---|---|
| 8,890,302 B2 | 11/2014 | Kong | |
| 2006/0180936 A1 | 8/2006 | Japp et al. | |
| 2008/0098595 A1* | 5/2008 | Kresge | H05K 1/115 29/830 |
| 2009/0108421 A1* | 4/2009 | Nelle | H01L 23/49513 257/669 |
| 2011/0074028 A1* | 3/2011 | Pendse | H01L 21/563 257/737 |
| 2011/0121449 A1* | 5/2011 | Lin | H01L 21/568 257/737 |
| 2014/0001643 A1* | 1/2014 | Kong | H01L 23/49822 257/774 |

\* cited by examiner

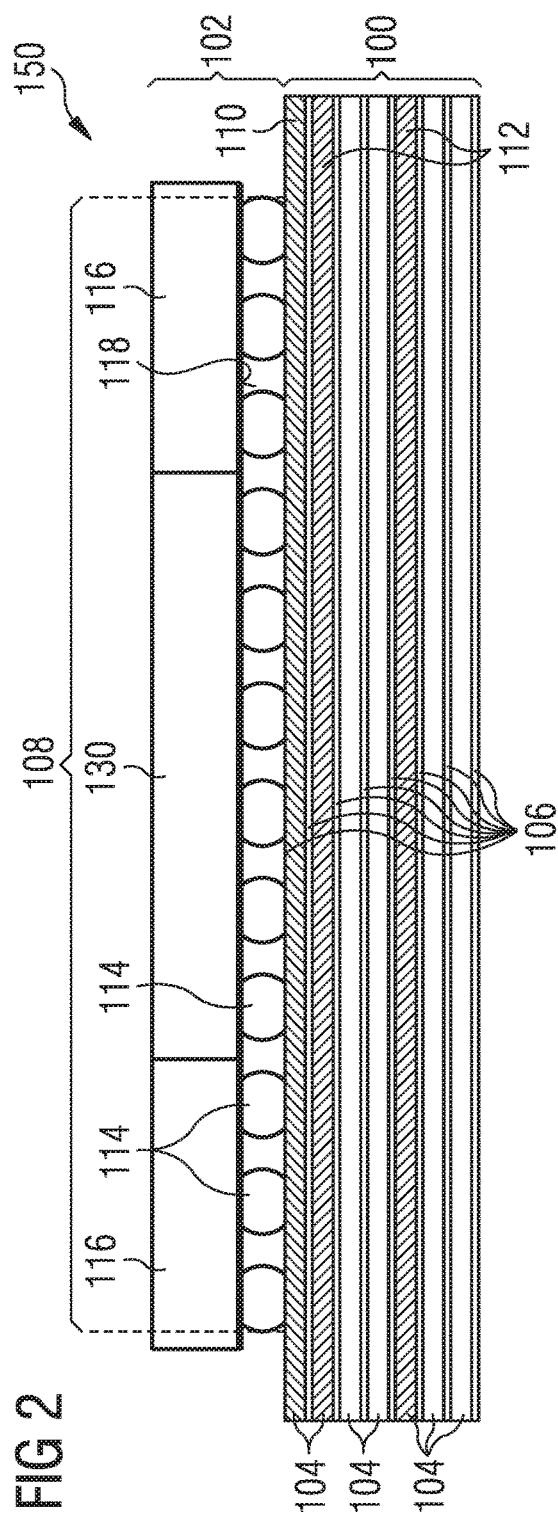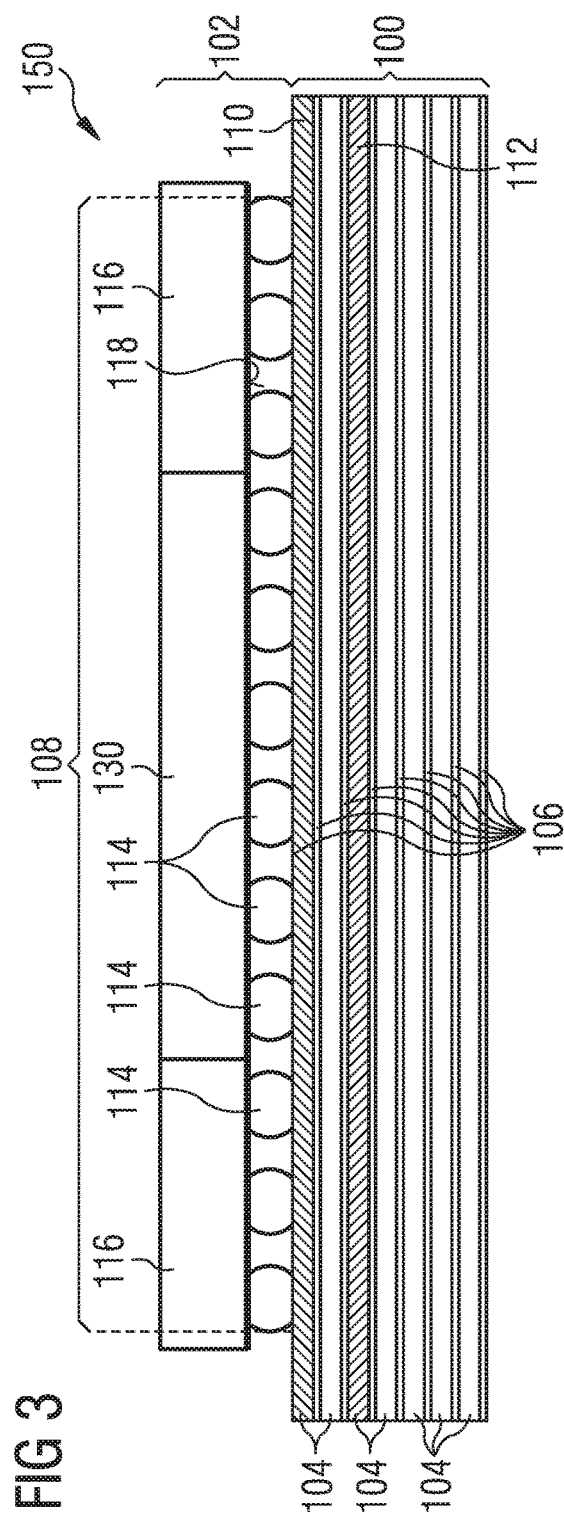

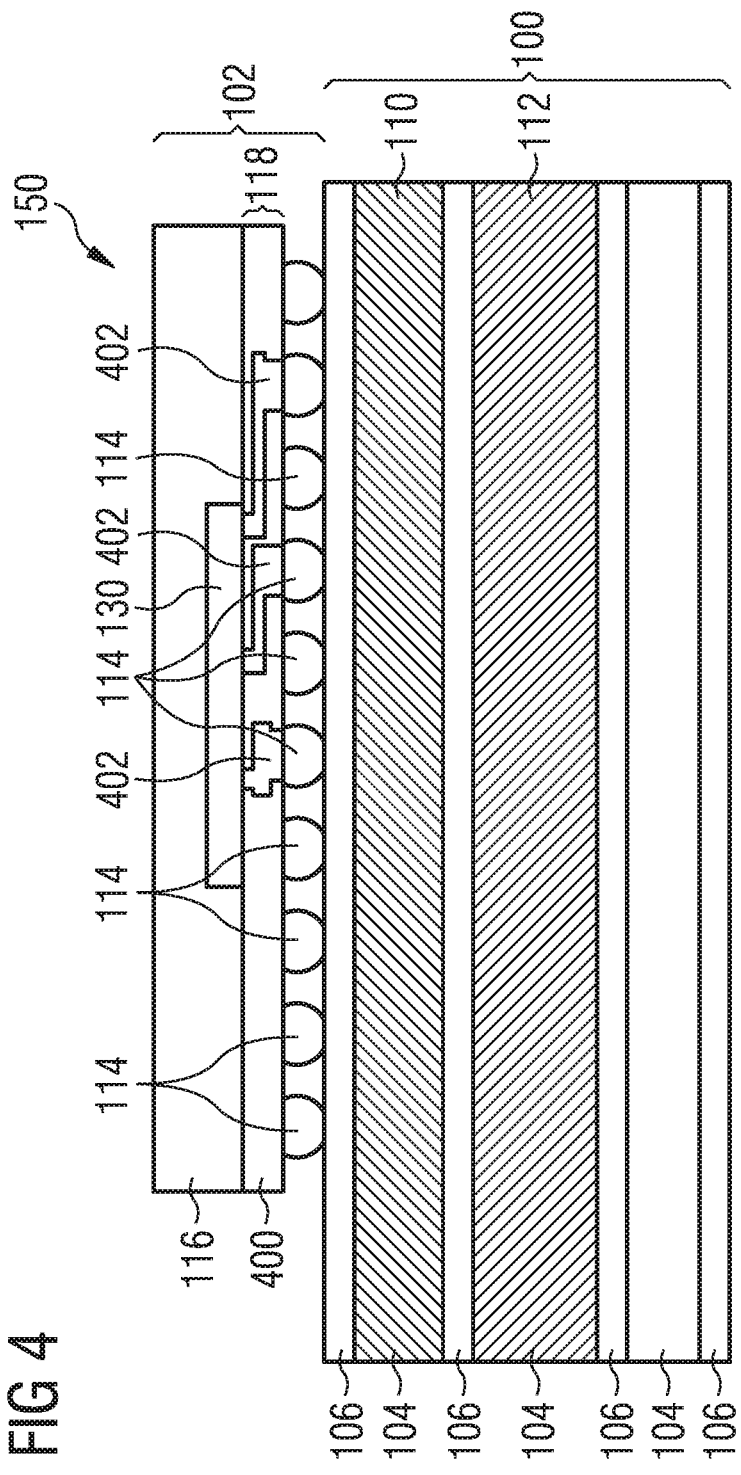

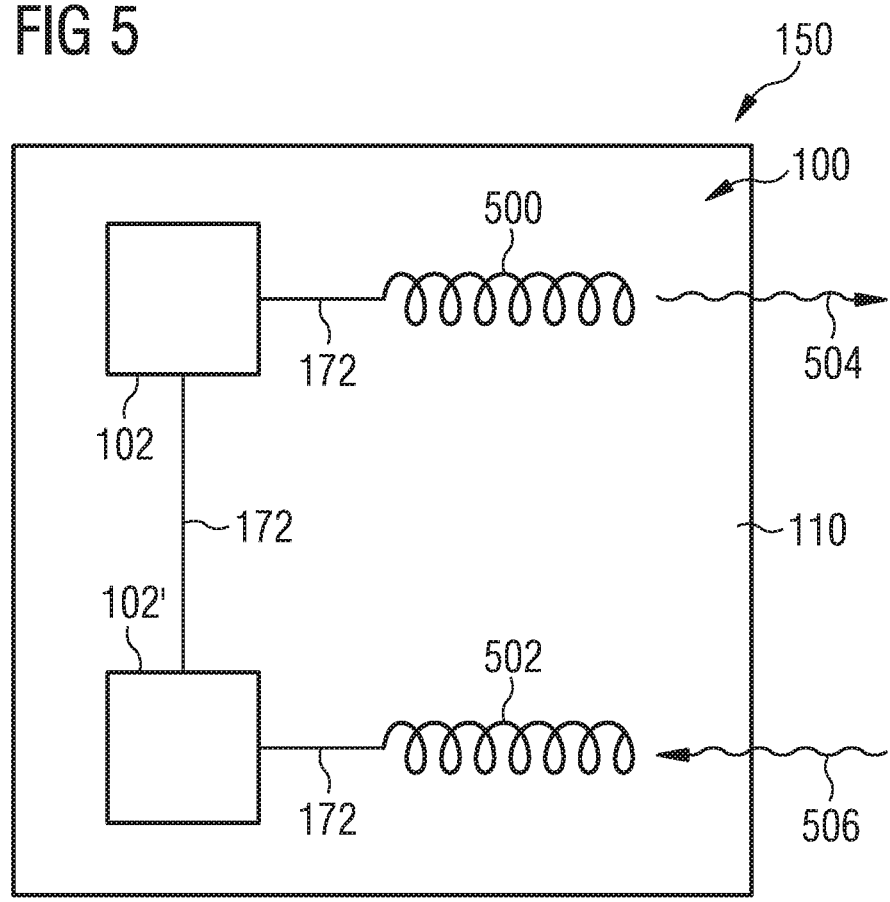
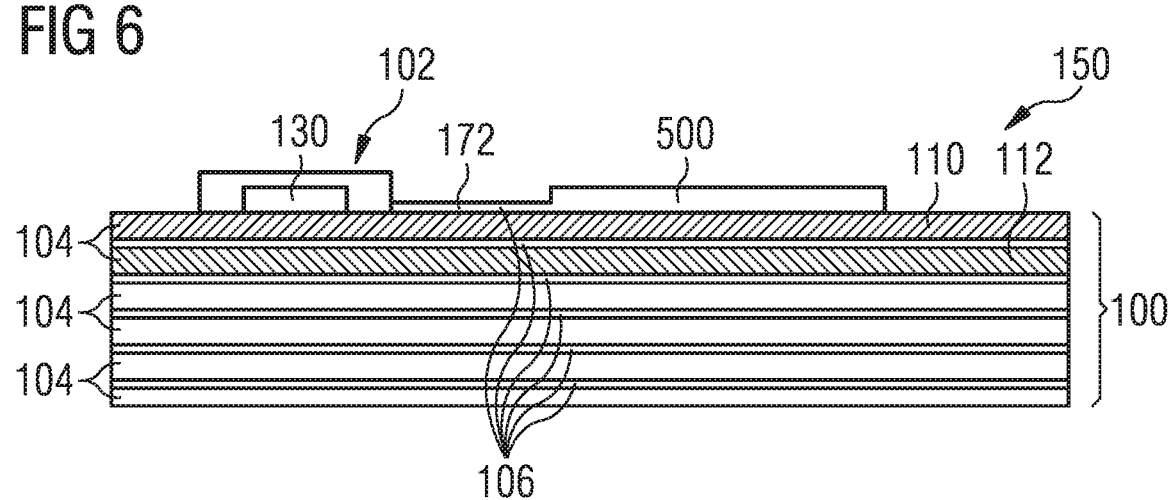

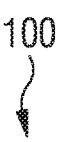
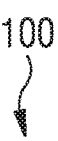

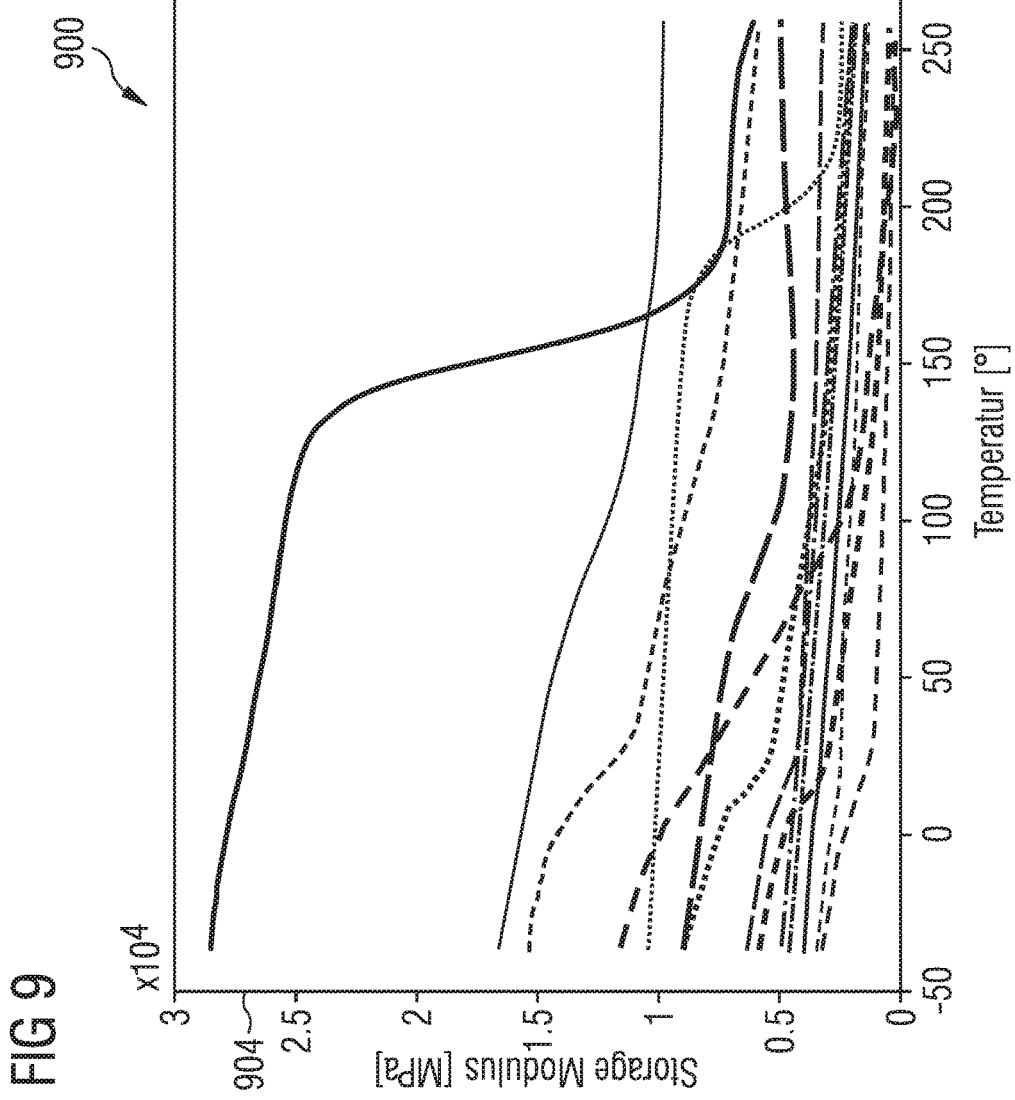

2nd layer is standard FR4 material (Reference)

| | |
|---|---|
| 8 layer PCB with 1x Rogers 3003 | 100% |
| 8 layer PCB with FR4 only | 178% |
| 8 layer PCB 1x Dupont TK1810018R | 157% |

1st layer is Dupont TK1810018R and 2nd layer is modified material

1050

| Parameters of 2nd layer | CTE in X, Y [ppm/K] | | | |
|---|---|---|---|---|
| Young's Modulus [GPa] | 7-9 | 9-11 | 11-13 | 13-15 |
| 43 (-40°C) ... 36 (125°C) | | 100% | | |
| FR4: 28,9 (-40°C) ... 23,9 (125°C) | 102% | 119% | 136% | 157% |
| 22 (-40°C) ... 18 (125°C) | | 129% | 143% | |
| 14,5 (-40°C) ... 12 (125°C) | | 140% | 151% | |
| 7 (-40°C) ... 6 (125°C) | | 152% | | |

CHIP CARRIER LAMINATE WITH HIGH FREQUENCY DIELECTRIC AND THERMOMECHANICAL BUFFER

BACKGROUND

Technical Field

Various embodiments relate generally to a chip carrier, an electronic arrangement, and a method of manufacturing a chip carrier.

Description of the Related Art

Packages may be denoted as encapsulated electronic chips with electrical connects extending out of the encapsulant and being mounted to an electronic periphery, for instance on a chip carrier such as a printed circuit board.

However, there is still potentially room to improve thermal and mechanical robustness of an arrangement formed of a printed circuit board and an encapsulated electronic chip mounted thereon.

SUMMARY

There may be a need for a chip carrier which, when an encapsulated electronic chip is mounted thereon, shows a proper reliability at an interface with the encapsulated electronic chip.

According to an exemplary embodiment, a chip carrier for carrying an encapsulated electronic chip is provided, wherein the chip carrier comprises a laminate structure formed as a stack of a plurality of electrically insulating structures and a plurality of electrically conductive structures, and a chip coupling area at an exposed surface of the laminate structure being configured for electrically and mechanically coupling the encapsulated electronic chip, wherein one of the electrically insulating structures is configured as high frequency dielectric made of a material being adapted for low-loss transmission of a high-frequency signal (such as a high-frequency electric signal propagating along an electrically conductive line on and/or in the high frequency dielectric), and wherein at least one other one of the electrically insulating structures and/or at least one of the electrically conductive structures is configured as a thermomechanical buffer configured for buffering thermally induced mechanical load.

According to another exemplary embodiment, an electronic arrangement is provided, wherein the electronic arrangement comprises an encapsulated electronic chip, and a chip carrier having the above-mentioned features carrying or for carrying the encapsulated electronic chip on the chip coupling area.

According to yet another exemplary embodiment, a method of manufacturing a chip carrier for carrying an encapsulated electronic chip is provided, wherein the method comprises forming a laminate structure as a stack of a plurality of electrically insulating structures and a plurality of electrically conductive structures, configuring a chip coupling area at an exposed surface of the laminate structure for electrically and mechanically coupling the encapsulated electronic chip, configuring one of the electrically insulating structures as high frequency dielectric made of a material being adapted for low-loss transmission of a high-frequency signal, and configuring at least one other of the electrically insulating structures and/or at least one of the electrically conductive structures as one or more thermomechanical buffers configured for buffering thermally induced mechanical load.

An exemplary embodiment has the advantage that, due to the synergetic combination of two structural elements (i.e. the high frequency dielectric and the thermomechanical buffer) of the chip carrier, the chip carrier is at the same time capable of transporting high-frequency signals with low signal loss on electric lines thereon or therein, while simultaneously thermomechanical stress can be efficiently buffered to thereby prevent undesired deformation, warpage and other mechanical deterioration in particular at an electric and mechanical interface between the chip carrier and a mounted electronic chip under the influence of ambient temperature changes over a broad range. By assigning the task of providing a proper electrical high-frequency behaviour to the high frequency dielectric and by assigning the task of providing a proper thermomechanical behaviour to another structural element, i.e. the thermomechanical buffer, each of these two structural elements can be optimized separately to be specifically appropriate to fulfil the respective function. Moreover, the freedom of a circuit designer to freely select materials for these two structural elements is advantageously increased. This allows also an improvement of the reproducibility of the manufactured chip carriers as well as the capability of the various materials to be pressed together for forming a mechanically stable laminate. Beyond this, the provision of a separate thermomechanical buffer has turned out as a valuable measure for increasing the lifetime of solder connections formed between the chip carrier and the encapsulated chip. Such solder connections are conventionally a significant mechanical weak point of an electronic arrangement of an encapsulated chip on a laminate type chip carrier and tend to crack or break in the presence of thermal load resulting from a different thermal expansion of different materials above and below the solder connections. By providing a separate thermomechanical buffer in addition to a high frequency dielectric, the solder connections are less prone to failure in the event of temperature changes.

When only a high frequency dielectric is provided in a chip carrier having apart from this only FR4 material for electrically insulating structures and copper material for electrically conductive structures (i.e. without thermomechanical buffer), only an extremely small number of materials may be used for the high frequency dielectric if proper reliability of solder connections is desired. When however, according to an exemplary embodiment, an additional thermomechanical buffer with material properties differing from standard FR4 material is implemented in the sequence of electrically insulating and electrically conductive structures of the chip carrier, the requirements for the high frequency dielectric become relaxed and the freedom of selecting a material for the high frequency dielectric is advantageously increased. Thus, according to an exemplary embodiment, the preferably uppermost material layer of the chip carrier can be configured as freely selectable high frequency dielectric and a preferably lower layer of the chip carrier is configured as a thermomechanical buffer. In such an architecture, the high frequency dielectric can still fulfill the criterion of dimensional stability, whereas the mechanical buffer function of the high frequency dielectric can be moderate or even weak, since a mechanical buffer function can be contributed by the separate thermomechanical buffer. These effects have been confirmed by simulations and experiments carried out by the present inventors. Thus, the number of usable high frequency dielectric materials is increased with low effort and without compromising on the lifetime of the solder connections. Moreover, these effects can be obtained with an advantageously only minor change of the composition of the chip carrier.

DESCRIPTION OF FURTHER EXEMPLARY EMBODIMENTS

In the following, further exemplary embodiments of the method, the chip carrier and the arrangement will be explained.

In the context of the present application, the term "laminate structure" may particularly denote an integral flat member formed by the electrically conductive structures and the electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In the context of the present application, the term "high frequency dielectric" may particularly denote an electrically insulating material which is suitable for high frequency applications when on and/or in the high frequency dielectric one or more electrically conductive lines carry a high frequency electric signal. The high frequency dielectric can be capable of carrying signals in the GHz range (for instance above 10 GHz, in particular above 50 GHz, for example between 70 GHz and 80 GHz) with low loss of signal intensity. The corresponding capability of a material of the high frequency dielectric is characterized by the loss angle $\delta$ or by the corresponding loss tangent $\tan \delta$. These parameters are indicative of a dissipation factor describing signal damping, i.e. the electric losses when a high-frequency signal propagates on an electric line formed on or embedded in the high frequency dielectric. Dielectric loss hence quantifies a dielectric material's inherent dissipation of electromagnetic energy into, for instance, heat. It can be parameterized in terms of either the loss angle $\delta$ or the corresponding loss tangent $\tan \delta$. Both refer to the phasor in the complex plane whose real and imaginary parts are the resistive (i.e. lossy) component of an electromagnetic field and its reactive (i.e. lossless) counterpart. Preferably, the value of $\tan \delta$ of the high frequency dielectric is lower than or equal to 0.017 (in particular at a high frequency of 77 GHz), more particularly is lower than or equal to 0.013 (in particular at a high frequency of 77 GHz). Preferably, the high frequency dielectric is a layer suitable for the formation of a high frequency laminate, i.e. can be pressed together with other electrically insulating structures (in particular layers) and electrically conductive structures (in particular layers) to form an integral laminate with reproducible properties. Moreover, the high frequency dielectric should have reliable electrically insulating properties, i.e. should be substantially incapable of conducting an electric signal through itself. Preferably but not necessarily, the value of the relative dielectric constant $\varepsilon_r$ of the high frequency dielectric should enable the transport of high frequency signals with short transit times. The high frequency dielectric significantly influences the electrical properties of the chip carrier.

In the context of the present application, the term "thermomechanical buffer" may particularly denote a structural component of the chip carrier which is capable of buffering mechanical load which is generated in the event of temperature changes (in particular temperature cycles) to which the chip carrier (in particular with encapsulated electronic chip mounted, in particular soldered, thereon) is exposed. Usually, the encapsulated chip with its relative low value of the thermal expansion coefficient (CTE) undergoes a significantly smaller thermal expansion than the constituents (usually FR4 or FR4-like materials and copper) of the laminate structure with its relative high value of the thermal expansion coefficient. The thermomechanical buffer, forming part of the chip carrier, may hence be made of a material having a relative or sufficiently low value of the thermal expansion coefficient, in particular having a lower value of the thermal expansion coefficient than the other materials of the chip carrier. For instance, it may have a value of the thermal expansion coefficient of lower than 9 ppm/K. The thermomechanical buffer may hence balance out or compensate differences between the value of the thermal expansion coefficient of the remaining structural components of the chip carrier on the one hand and of the encapsulated chip on the other hand. The thermomechanical buffer significantly influences the mechanical properties of the chip carrier.

In an embodiment, the thermomechanical buffer is made of a material having a low thermal expansion coefficient, in particular a low thermal expansion coefficient within a plane being perpendicular with regard to a stacking direction of the electrically conductive structures and the electrically insulating structures. According to this embodiment, the material of the thermomechanical buffer experiences only a small to moderate thermal expansion when the temperature rises, at least within a plane of the flat laminate structure. Thereby, pronounced differences of the thermal expansion of the other materials of the chip carrier on the one hand and the material of the encapsulated chip on the other hand can be equilibrated to thereby suppress thermally induced deformation or warpage of the chip carrier and consequently deterioration or breakage of the solder connections.

In an embodiment, the thermomechanical buffer is made of a material having a lower thermal expansion coefficient, in particular a lower thermal expansion coefficient within a plane being perpendicular with regard to a stacking direction of the electrically conductive structures and the electrically insulating structures, than the remaining electrically conductive structures and electrically insulating structures. The term "the remaining electrically conductive structures and electrically insulating structures" may denote all electrically conductive structures and electrically insulating structures apart from the high frequency dielectric, and optionally also of the thermomechanical buffer. In particular, the remaining electrically conductive structures may be made of copper, and the remaining electrically insulating structures may be made of FR4. In the plane of the flat laminate structure these remaining materials may have a value of the thermal expansion coefficient of more than 10 ppm/K, whereas materials of the encapsulated chip may for instance have a value of the thermal expansion coefficient of about 3-6 ppm/K. When the value of the thermal expansion coefficient of the thermomechanical buffer is in between these ranges, it may provide a smooth transition to thereby promote mechanical integrity of all elements of the electronic arrangement, including solder connections (such as solder dots).

In an embodiment, a value of the thermal expansion coefficient, in particular within a plane being perpendicular with regard to a stacking direction of the electrically conductive structures and the electrically insulating structures, of the thermomechanical buffer is larger than that of the encapsulated electronic chip, in particular than that of the electronic chip and/or of its encapsulant, and smaller than that of all remaining of the electrically insulating structures of the chip carrier. With such an intermediate property in terms of thermal expansion, the thermomechanical buffer may provide for a smooth, non-abrupt transition of the extent of thermal expansion in the stacking direction. An electronic arrangement with a high quality and a high lifetime may thereby be obtained.

In an embodiment, the thermomechanical buffer is made of a material having a linear thermal expansion coefficient, in particular within a plane being perpendicular with regard to a stacking direction of the electrically conductive structures and the electrically insulating structures, in a range between 1 ppm/K and 9 ppm/K, in particular in a range between 3 ppm/K and 8 ppm/K, in an entire temperature range between 300 K and 400 K. When the value becomes too large, the quality of the solder connection suffers. When the value becomes too small, the discrepancy to the value of the encapsulated package becomes too large.

In an embodiment, the high frequency dielectric is located closer to the chip coupling area than all other of the electrically insulating structures. In particular, the high frequency dielectric may form the uppermost electrically insulating layer of the chip carrier, i.e. the electrically insulating layer being closest to the surface of the chip carrier on which the solder dots of the encapsulated chip package are to be attached. Electric lines conducting the high-frequency signal can be formed directly on an exposed surface of the high frequency dielectric, or embedded therein, for a low-loss signal transmission. Positioning the high frequency dielectric as close as possible to the chip sided surface of the chip carrier has turned out as the most efficient way of enabling low loss propagation of RF (radio frequency) signals.

In an alternative embodiment, the high frequency dielectric may however also be located within an interior of the stack of the electrically insulating structures.

In an embodiment, the thermomechanical buffer is located closer to the high frequency dielectric than all remaining of the electrically insulating structures. In particular, the thermomechanical buffer may be the second electrically insulating structure counted from the chip sided surface of the chip carrier. It may be located directly adjacent to the high frequency dielectric or may be separated from the high frequency dielectric only by an electrically conductive structure such as a (for instance patterned) layer (for instance of copper). It has turned out to be most efficient when the thermomechanical buffer, having the function of mechanically decoupling the packaged electronic chip from the lower structures of the chip carrier in terms of thermally induced mechanical load, is located—in the sequence of the electrically insulating structures—directly between the high frequency dielectric on the one hand and all remaining FR4-type electrically insulating structures of the laminate structure on the other hand. Then, the impact of the thermomechanical buffer on the lifetime of the solder connections is most pronounced.

In an alternative embodiment, the thermomechanical buffer is located buried deeper within the remaining of the electrically insulating structures. In other words, at least one of the remaining electrically conductive structures (for example made of FR4 material) may be positioned between the high frequency dielectric and the thermomechanical buffer. Although it is presently believed that the thermomechanical decoupling of the thermomechanical buffer works best when the thermomechanical buffer is located as close as possible to the high frequency dielectric (since this most ideally decouples high-CTE zones from low-CTE zones), there may be situations in which it is desired that at least one other (in particular dielectric) structure is arranged in between the high frequency dielectric and the thermomechanical buffer (for example for purposes of proper adhesion between directly contacting structures). In such a scenario it is advantageous when the described embodiment offers the freedom to position the thermomechanical buffer deeper within the laminate stack.

In an embodiment, a plurality of separate thermomechanical buffers may be arranged within the laminate structure. The thermomechanical buffers may be separated from one another by others of the electrically conductive structures and/or of the electrically insulating structures. By providing multiple thermomechanical buffers, the reliability of the chip carrier (and in particular of its solder connections to the encapsulated chip) can be guaranteed over an even longer term by refining the protection again thermomechanical deformation within the chip carrier.

In an embodiment, all remaining of the electrically insulating structures (i.e. all electrically insulating structures apart from the high frequency dielectric and optionally also apart from the thermomechanical buffer) are made of FR4 or prepreg. The mentioned materials may comprise resin and glass fibers.

In an embodiment, the thermomechanical buffer is made of a material having a value of the Young modulus, in particular within a plane being perpendicular with regard to a stacking direction of the electrically conductive structures and the electrically insulating structures, in a range between 23 GPa and 40 GPa, in an entire temperature range between 300 K and 400 K. The best results can be obtained with a thermomechanical buffer being neither too soft nor to stiff. If it becomes too soft, mechanical integrity of the chip carrier can be deteriorated. If it becomes too stiff, its capability as PCB material may become problematic.

In an embodiment, at least a part of the plurality of electrically insulating structures and/or at least a part of the plurality of electrically conductive structures is configured as a layer. At least part of these layers may be continuous and/or at least part of these layers may be patterned. The layers may be aligned parallel to one another so as to form a flat sheet like structure. For example, a thickness of any of the electrically conductive layers may be in a range between 0.005 mm and 0.30 mm, in particular in a range between 0.01 mm and 0.23 mm. For example, a thickness of any of the electrically insulating layers may be in a range between 0.05 mm and 0.40 mm, in particular in a range between 0.10 mm and 0.15 mm.

In an embodiment, a material of the high frequency dielectric is selected from a group consisting of Polytetrafluoroethylene (Teflon), a resin (such as an epoxy resin) and/or a sandwich structure (for example a laminate of several layers). Examples of appropriate high frequency dielectrics are Rogers3003 and Dupont TK1810018R. Other materials are however possible as well.

In an embodiment, a material of the thermomechanical buffer is selected from a group consisting of a resin, a glass fiber-resin composite, an FR4 type material, Panasonic R-1515F, Panasonic R-1515G, Panasonic R-1515W, Stablcor, Cu-Invar-Cu, and Panasonic R-1755. Other materials are however possible as well.

In an embodiment, at least one, in particular a plurality of solder dots are provided (in particular at a carrier sided surface of the packaged chip) which are configured for providing a solder connection between the at least one encapsulated electronic chip and the chip coupling area. In one embodiment, the solder dots may form part of the encapsulated chip, i.e. may be provided to the electronic arrangement from a package side.

In an embodiment, the solder dots are made of an alloy of tin, silver and copper. Such a (particularly lead free) $Sn_x Ag_y Cu_z$ alloy is to some extent capable of creeping in the presence of mechanical or thermal load, which additionally increases the lifetime of the electronic arrangement and the reliability of the solder connection.

In an embodiment, the chip carrier is configured as a printed circuit board (PCB). Electrically conductive structures of such a PCB may be made of copper, whereas part of the electrically insulating structures of such a PCB may be made of a resin and glass fiber comprising material such as FR4. Such materials may have a value of the thermal expansion coefficient in a range between 10 ppm/K and 15 ppm/K. Copper, which may be used in PCB technology together with such materials may have a value of the thermal expansion coefficient of about 17 ppm/K.

In an embodiment, the at least one electronic chip is configured as a high-frequency electronic chip, in particularly at least one of the group consisting of a radar control chip, an emitter chip for emitting a high-frequency signal to an antenna structure, and a receiver chip for receiving a high-frequency signal from an antenna structure. For example, the emitter chip may transmit a primary electric high frequency signal via the electrically conductive lines on the high frequency dielectric to an emitter antenna to be emitted, in the form of electromagnetic radiation, from a vehicle to an obstacle in an environment from where it is reflected as a secondary electromagnetic radiation signal to a receiver antenna of the electronic arrangement. The receiver antenna captures the secondary electromagnetic radiation signal and forwards a corresponding electric signal via the electrically conductive lines on the high frequency dielectric to the receiver chip. The receiver chip may then determine information indicative of a distance between the vehicle and the obstacle based on the signal.

In an embodiment, the encapsulated electronic chip comprises an encapsulation structure encapsulating at least part of the electronic chip. By such an encapsulant the chip may be embedded into an electrically insulating mass (such as a moulding compound for instance of plastic or a silicone casting or a polyimide-based spray coating). Typically, such materials have a value of the thermal expansion coefficient in a range between 5 ppm/K and 7 ppm/K, in many cases around 6 ppm/K. For comparison, silicon as a typical material of the electronic chip may have a value of the thermal expansion coefficient of around 3 ppm/K.

In an embodiment, the encapsulant may be an electrically insulating material or dielectric material. For instance, such an encapsulant may be a moulding compound or a silicone casting or a polyimide-based spray coating. The encapsulant may be made of a thermosetting material or a thermoplastic material. The encapsulant may be formed by transfer moulding, injection moulding, etc. The encapsulant may also be a laminate or a foil stack (for instance of a polymer material). For the packaging, moulding or encapsulant, a plastic material or a ceramic material may be used.

In an embodiment, the encapsulated electronic chip comprises an electrically conductive coupling structure for electrically coupling the electronic chip (in particular the semiconductor part thereof) to the chip coupling area of the chip carrier. Such a coupling structure may be a redistribution layer (RDL), i.e. electrically conductive leads in a dielectric matrix, forming an electronic and dimensional interface between small-dimensioned chip pads and larger dimensioned solder dots on a chip carrier sided surface of the packaged semiconductor chip.

Correspondingly, the encapsulated electronic chip may be configured as an embedded Wafer Level Ball Grid Array (eWLB) package. In particular, an exemplary embodiment provides a PCB construction capable of increasing the reliability and the lifetime of solder connections of ball grid array packages. More specifically, one embodiment allows to increase the reliability of a solder connection of an eWLB package (for instance for an automotive radar high-frequency application) independently of a high frequency laminate material within the PCB, by providing an additional thermomechanical buffer preferably below (and even more preferably directly below) the high frequency laminate.

In an embodiment, the method further comprises mounting (in particular under formation of a solder connection) the encapsulated electronic chip at the chip coupling area for electrically and mechanically coupling the encapsulated electronic chip to the chip carrier. The at least one electronic chip may thereby be electrically coupled via the electrically conductive structures of the chip carrier to other packaged or non-packaged electronic chips which may be surface mounted on the chip carrier as well, and/or may be electrically coupled via the electrically conductive structures to other active or passive electronic components (such as one or more antenna structures).

In an embodiment, the method further comprises forming the laminate structure by pressing the plurality of electrically insulating structures and the plurality of electrically conductive structures together. Thus, in particular the material of the thermomechanical buffer and of the high frequency dielectric may be advantageously capable of withstanding pressing forces and temperatures typical for PCB technology. Since the functional tasks of providing high frequency compatibility and thermomechanical stress buffering are structurally separated in the chip carrier, the freedom of selecting materials for the structures fulfilling these functions is increased so that it is feasible for a circuit designer to achieve compliance with the above requirements.

The one or more electronic chips may be semiconductor chips, in particular dies. In an embodiment, the at least one electronic chip is configured as a power semiconductor chip, in particular comprising at least one of the group consisting of a diode, and a transistor, more particularly an insulated gate bipolar transistor. In an embodiment, the device is configured as a power module. For instance, the one or more electronic chips may be used as semiconductor chips for power applications for instance in the automotive field. In an embodiment, at least one electronic chip may comprise a logic IC or an electronic chip for RF power applications. In one embodiment, the electronic chip(s) may be used as one or more sensors or actuators in microelectromechanical systems (MEMS), for example as pressure sensors or acceleration sensors.

As substrate or wafer for the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Optionally, the uppermost electrically conductive structure of the chip carrier may be covered by a solder resist for protection against oxidation and to prevent solder bridges from forming between closely spaced solder pads. However, such a very thin lacquer-like layer of polymer does not form part of the laminate structure of electrically conductive and electrically insulating structures but may be optionally applied (in particular as a thin film coating) on top of the laminate structure.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 2 shows a cross-sectional view of an electronic arrangement composed of an encapsulated electronic chip and a chip carrier according to another exemplary embodiment.

FIG. 3 shows a cross-sectional view of an electronic arrangement composed of an encapsulated electronic chip and a chip carrier according to another exemplary embodiment.

FIG. 4 shows a cross-sectional view of an electronic arrangement composed of an encapsulated electronic chip and a chip carrier according to yet another exemplary embodiment.

FIG. 5 shows a plan view and FIG. 6 shows a cross-sectional view of an electronic arrangement composed of two interconnected encapsulated electronic chips connected to an antenna structure and a chip carrier according to another exemplary embodiment.

FIG. 7 and FIG. 8 show schematic cross-sectional views of chip carriers according to other exemplary embodiments.

FIG. 9 shows a diagram indicative of the temperature dependence of the Young modulus of different materials for a high frequency dielectric of a chip carrier according to an exemplary embodiment.

FIG. 10 shows two tables indicating the impact of materials of a conventional chip carrier and a chip carrier according to an exemplary embodiment on the lifetime of a solder connection between the respective chip carrier and an encapsulated electronic chip.

DETAILED DESCRIPTION

Figure 1:
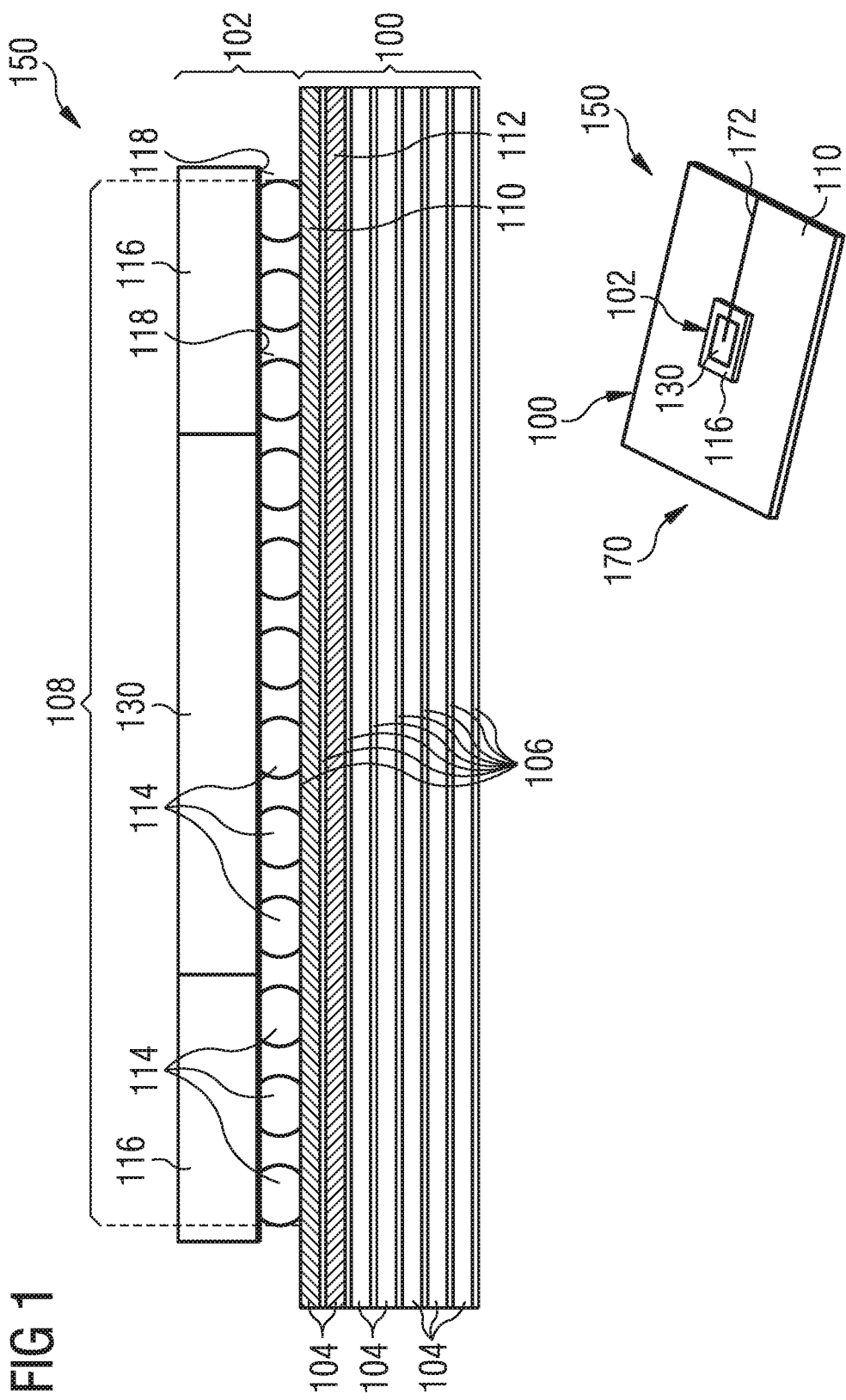
FIG. 1 shows a cross-sectional view and a plan view of an electronic arrangement composed of an encapsulated electronic chip and a chip carrier according to an exemplary embodiment.

The illustration in the drawing is schematically and not to scale.

FIG. 1 shows a cross-sectional view of an electronic arrangement 150 according to an exemplary embodiment composed of an encapsulated electronic chip 102, here embodied as a package of a semiconductor chip 130 within an encapsulation structure 116 of a moulding compound of plastic, and a chip carrier 100, here embodied as a specifically configured printed circuit board (PCB). The chip carrier 100 carries the encapsulated electronic chip 102 on a chip coupling area 108 of the chip carrier 100. The electronic arrangement 150 according to FIG. 1 is an embedded Wafer Level Ball Grid Array (eWLB) package.

The encapsulated electronic chip 102 comprises encapsulation structure 116, embodied as moulding compound which may be made of plastic material, encapsulating part of semiconductor chip 130. The semiconductor chip 130, in turn, has monolithically integrated circuit elements (not shown) in accordance with a certain electronic application which the semiconductor chip 130 shall fulfill in terms of the electronic arrangement 150. The encapsulated electronic chip 102 furthermore comprises a set of solder dots 114, here embodied as a number of substantially spherical solder balls, configured for providing a solder connection with the chip carrier 100 at the chip coupling area 108. The solder dots 114 are made of an electrically conductive and mechanically stable alloy of tin, silver and copper which is capable of creep to thereby balance out mechanical stress. Moreover, the encapsulated electronic chip 102 comprises an electrically conductive coupling structure 118 for electrically coupling the electronic chip 102 to the chip coupling area 108 of the chip carrier 100. The coupling structure 118 is embodied as a redistribution layer (RDL), i.e. a layer sequence of electrically conductive lines within a dielectric matrix for translating between a small dimension of chip pads (not shown) and a larger dimension of the solder dots 114 (a possible composition of the electrically conductive coupling structure 118 is shown in further detail in FIG. 4).

The chip carrier 100 is a plate composed of a sheet-like flat laminate structure formed as a stack of parallel layers. The layer stack is embodied as an alternating sequence of a plurality of electrically insulating structures 104 (made of different materials, as described in the following in detail) and a plurality of electrically conductive structures 106 (here all embodied as patterned copper sheets). The chip coupling area 108 is foreseen at an exposed main surface of the laminate structure being configured for electrically and mechanically coupling the encapsulated electronic chip 102.

The uppermost of the electrically insulating structures 104 is configured as a layer denoted as high frequency dielectric 110 which is made of a material being adapted for low-loss transmission of a high-frequency signal propagating on electrically conductive material directly on the high frequency dielectric 110. The material of the high frequency dielectric 110 is characterized by a sufficiently small value of the loss angle δ. The parameter tan δ describes losses of a high-frequency electric signal propagating on the uppermost electrically conductive structure 106 directly at the upper main surface of the chip carrier 100 and therefore directly on the high frequency dielectric 110. In the present embodiment, the material of the high frequency dielectric 110 has a value of tan δ of 0.013. Moreover, the material of the high frequency dielectric 110 according to FIG. 1 may for example have a value of the relative dielectric constant $\varepsilon_r$ of approximately 3 (but may also have another value, for instance in the range between 2 and 4, or even outside of this range) to thereby ensure reliable electrically insulating properties of the high frequency dielectric 110. The high frequency dielectric 110 is compatible with high frequency applications, for instance automotive radar applications at frequency values of several 10 GHz (for instance 77 GHz). Since the high frequency dielectric 110 forms part of the above-mentioned integral laminate structure together with the other electrically insulating structures 104 and the electrically conductive structures 106 connected by pressing them together, the high frequency dielectric 110 may also be denoted as a high-frequency laminate. For example, the material of the high frequency dielectric 110 may be Rogers3003 or Dupont TK1810018R.

The next electrically insulating structure 104 which is located closest to the high frequency dielectric 110, and separated therefrom only by a single one of the electrically conductive structures 106, is a layer denoted as thermomechanical buffer 112. The thermomechanical buffer 112 is adapted to adjust the thermomechanical properties of the electronic arrangement 150 and is specifically configured for buffering thermally induced mechanical load resulting from different values of the thermal expansion coefficient (CTE)

of the constituents of the electronic arrangement 150. More specifically, the thermomechanical buffer 112 mechanically decouples the layer sequence below the thermomechanical buffer 112 from the layer sequence and the solder-connected encapsulated electronic chip 102 above the thermomechanical buffer 112. The material below the thermomechanical buffer 112 has a relatively high CTE value, the material above the thermomechanical buffer 112 has a relatively low CTE value. All remaining electrically insulating structures 104 below the thermomechanical buffer 112 are FR4 layers (i.e. glass fibers embedded in epoxy resin) with a CTE value in a range between about 10 ppm/K to about 15 ppm/K. The effective CTE value of material of the encapsulated electronic chip 102 above the thermomechanical buffer 112 is dominated by silicon material of the semiconductor chip 130 (having a CTE value of about 3 ppm/K) and plastic moulding compound material of encapsulation structure 116 (having a CTE value of about 6 ppm/K). In the event of temperature changes, the amount of thermal expansion or thermal compression of the material above and the material below the thermomechanical buffer 112 may differ significantly which may result in warpage and undesired bending of the electronic arrangement 150. This may exert enormous forces on the solder dots 114 forming the electric and mechanical interface between the encapsulated chip 102 and a chip carrier 100. As a consequence, cracks may develop at the solder dots 114 over time and after many thermal cycles which reduces the long-term quality and the lifetime of the electronic arrangement 150. The present inventors have surprisingly found that exactly this effect can be efficiently suppressed by providing a thermomechanical buffer 112 in addition to the high frequency dielectric 110 within the parallel stack of electrically insulating structures 104. The thermomechanical buffer 112 has the capability to equilibrate or balance out such warpage and undesired deformation and consequently protects in particular the solder dots 114 and therefore the solder connection between encapsulated electronic chip 102 and chip carrier 100 as a whole from failure. In order to provide a smooth transition between the relatively high CTE portion below and the relatively low CTE above the thermomechanical buffer 112, the thermomechanical buffer 112 is advantageously made of a material having a lower thermal expansion coefficient compared to other PCB dielectric materials, in particular FR4 materials. More precisely, the thermomechanical buffer 112 has the mentioned low thermal expansion coefficient at least within a plane being horizontal according to FIG. 1 and perpendicular with regard to a (according to FIG. 1 vertical) stacking direction of the electrically conductive structures 106 and the electrically insulating structures 104.

Preferably, the linear CTE value of the material of the thermomechanical buffer 112 in the horizontal plane according to FIG. 1 is in a range between 6 ppm/K and 9 ppm/K over the entire temperature range between 300 K and 400 K (i.e. typical operation temperatures of the electronic arrangement 150).

The material of the thermomechanical buffer 112 has a value of the Young modulus within the horizontal plane according to FIG. 1 in a range between 23 GPa and 40 GPa over the entire temperature range between 300 K and 400 K. Thus, the thermomechanical buffer 112 should be neither too soft nor too rigid to perfectly fulfill its task of suppressing mechanical deformation of the electronic arrangement 150 in the presence of thermally induced stress.

Since the thermomechanical buffer 112 forms the above-mentioned integral laminate structure together with the other electrically insulating structures 104 and the electrically conductive structures 106 by pressing them together, the thermomechanical buffer 112 may also be denoted as a thermomechanical buffer laminate. For instance, the material of the thermomechanical buffer 112 may be a suitable resin. However, the thermomechanical buffer 112 may be made alternatively of a glass fiber-resin composite, Panasonic R-1515F, Panasonic R-1515G or Panasonic R-1755.

Hence, the chip carrier 100 is a printed circuit board (PCB) with the two uppermost electrically insulating layers 110, 112 being modified for adjusting the mechanical and electrical properties of electronic arrangement 150 formed by this chip carrier 100 and the high-frequency application encapsulated chip 102.

A detail 170 of FIG. 1 shows a three-dimensional plan view of the electronic arrangement 150 and particularly shows as to how an electrically conductive line 172 of the uppermost electrically conductive structure 106 according to the cross-sectional view of FIG. 1 runs along an upper surface of the high frequency dielectric 110 and is capable of transporting an electric high-frequency signal (for instance in the order of magnitude of several 10 GHz, in particular 77 GHz) between the semiconductor chip 130 and other electronic components (not shown in detail 170) of the electronic arrangement 150. Such other electronic components can be one or more further encapsulated chips or one or more active and/or passive electronic members, for instance an antenna.

FIG. 2 shows a cross-sectional view of an electronic arrangement 150 composed of an encapsulated electronic chip 102 and a chip carrier 100 according to another exemplary embodiment. The electronic arrangement 150 according to FIG. 2 differs from the electronic arrangement 150 according to FIG. 1 in that an additional thermomechanical buffer 112 is provided in FIG. 2 as one of the electrically insulating structures 104 beneath the thermomechanical buffer 112 of FIG. 1. Thus, according to FIG. 2, two thermomechanical buffers 112 are provided which are separated from one another by FR4 type electrically insulating structures 104 and electrically conductive structures 106 (of copper) of the chip carrier 100. Hence, the mechanical decoupling of definable portions of the electronic arrangement 150 is further refined so that any tendencies of warpage of the chip carrier 100 can be suppressed even stronger and the solder dots 114 can be efficiently protected against thermally induced mechanical load. In yet another exemplary embodiment, it is also possible to provide three, four or even more thermomechanical buffers 112 within the chip carrier 100.

FIG. 3 shows a cross-sectional view of an electronic arrangement 150 composed of an encapsulated electronic chip 102 and a chip carrier 100 according to another exemplary embodiment. Although it has turned out as particularly highly efficient to locate at least one of the at least one thermomechanical buffer 112 directly adjacent to the high frequency dielectric 110 in the layer sequence of electrically insulating structures 104 (as in FIG. 1 and FIG. 2), it is nevertheless possible in other embodiments to interpose one or more FR4 type electrically insulating structures 104 between the high frequency dielectric 110 and a single thermomechanical buffer 112 (as in FIG. 3) or, more generally, an uppermost of multiple thermomechanical buffers 112. A corresponding embodiment is shown in FIG. 3 where one FR4 type electrically insulating structure 104 is located between the high frequency dielectric 110 and the thermomechanical buffer 112 in the vertical stack of dielectric layers of the chip carrier 100.

FIG. 4 shows a cross-sectional view of an electronic arrangement 150 composed of an encapsulated electronic chip 102 and a chip carrier 100 according to still another exemplary embodiment. The coupling structure 118, already shown in FIG. 1 to FIG. 3, is illustrated in further detail in FIG. 4. The coupling structure 118 is embodied as redistribution layer (RDL) which comprises electrically conductive lines 402 of copper within a dielectric matrix 400 for translating between a small dimension of chip pads (not shown) and a larger dimension of the solder dots 114. According to FIG. 4, the various electrically insulating structures 104 differ in thickness and, compared to FIG. 1 to FIG. 3, in their number.

FIG. 5 shows a plan view and FIG. 6 shows a cross-sectional view of an electronic arrangement 150 composed of two interconnected encapsulated electronic chips 102, 102' connected to an antenna structure 500, 502 and a chip carrier 100 according to yet another exemplary embodiment. The electronic arrangement 150 is configured as a high-frequency radar automotive application for determining a distance between a vehicle in which the electronic arrangement 150 is installed and an obstacle in front of the vehicle.

According to FIG. 5 and FIG. 6, the encapsulated electronic chip 102 is configured as a high-frequency emitter chip for emitting an electric high-frequency signal to an antenna structure 500. This high-frequency signal is transmitted from the encapsulated electronic chip 102 to the antenna structure 500 via an electrically conductive line 172 running along a main surface of the high frequency dielectric 110. Upon receipt of this high-frequency signal, the antenna structure 500 emits a primary electromagnetic radiation signal 504 which propagates towards the obstacle (not shown).

In addition, a further encapsulated electronic chip 102' is surface mounted on the chip carrier 110 and is configured as a high-frequency receiver chip for receiving an electric high-frequency signal from a further antenna structure 502. The encapsulated electronic chip 102 and the further encapsulated electronic chip 102' are interconnected for exchange of electric signals via an electrically conductive line 172 running along a main surface of the high frequency dielectric 110.

After the above-mentioned primary electromagnetic radiation signal 504 has reached the obstacle, it is reflected from the obstacle as secondary electromagnetic radiation signal 506 which propagates backwardly to the further antenna structure 502. The further antenna structure 502, after receipt of the secondary electromagnetic radiation signal 506, transmits an electric high-frequency signal via electrically conductive line 172 to the further encapsulated electronic chip 102'. Upon receipt of this high-frequency signal, the further encapsulated electronic chip 102', having knowledge about the high-frequency signal which has been previously sent out by the encapsulated electronic chip 102, is then capable of calculating the distance between the vehicle and the obstacle.

In view of the high frequency dielectric 110, having a sufficiently small value of the loss angle δ, the transmission of the electrical high-frequency signal via lines 172 can occur with very low loss of the signal intensity and signal shape. In view of the thermomechanical buffer 112, a reliable solder connection between the encapsulated electronic chips 102, 102' can be ensured.

FIG. 7 and FIG. 8 show cross-sectional views of chip carriers 100 according to other exemplary embodiments. Both embodiments show that the thermomechanical buffer 112 can also be realized by an electrically conductive material. According to FIG. 7, the thermomechanical buffer 112 is realized as Stablcor material (i.e. a carbon composite laminate). According to FIG. 8, the thermomechanical buffer 112 is realized as Invar material (i.e. a nickel-iron alloy). The electrically conductive structures 106 are realized as copper layers denoted with numbers 1 to 8. In both embodiments, two thermomechanical buffers 112 are foreseen, whereas alternatively a single thermomechanical buffer 112 of Stablcor material or Invar material is possible as well. Furthermore, exposed surfaces of the shown laminate structure may be optionally coated with a thin film of solder resist 700.

FIG. 9 shows a diagram 900 indicative of the temperature dependence of the Young modulus of different materials for a high frequency dielectric 110 of a chip carrier 100 according to an exemplary embodiment. Along an abscissa 902, the temperature is plotted. Along an ordinate 904, the value of the Young modulus at the respective temperature and for the respective material is plotted. In view of the provision of a high frequency dielectric 110 (preferably at the uppermost end of the laminate structure of the chip carrier 100) and an additional separate thermomechanical buffer 112 (preferably as second laminated electrically insulating layer counted from the upper main surface of the chip carrier 100), the freedom of selecting a material for the high frequency dielectric 110 without involving significant problems of warpage is increased. All materials shown in FIG. 9 (with the exception of the Panasonic_FR_4) are appropriate choices for the high frequency dielectric 110 when an additional thermomechanical buffer 112 is foreseen.

FIG. 10 shows two tables 1000, 1050 indicating the impact of materials of a conventional chip carrier and a chip carrier 100 according to an exemplary embodiment on the lifetime of a solder connection between the respective chip carrier 100 and an encapsulated electronic chip 102.

Table 1000 indicates in its first row thermally induced mechanical load acting on a solder connection (i.e. a parameter being the larger the smaller the lifetime is), normalized to 100%, of a solder connection of a conventional reference chip carrier configured as an 8-layer PCB with a high frequency dielectric made of Rogers 3003 material and six electrically insulating FR4 layers. Table 1000 furthermore shows in its second row that the substitution of the high frequency dielectric made of Rogers 3003 by a further standard FR4 layer increases the mechanical load by 78%. Substituting the high frequency dielectric made of Rogers 3003 by another commercially available high frequency dielectric (Dupont TK1810018R) does not really help, since it also increases the mechanical load by 57% (see third row of Table 1000). Still referring to Table 1000, the influence of the uppermost electrically insulating structure 104 on the load acting on the solder dots 116 (more precisely the outermost solder dot 116 according to FIG. 1) is shown. The reference configuration with Rogers 3003 correlates with a load of 100%. The higher the load, the smaller is the lifetime of the solder dots to be expected. Correspondingly, the PCB with the standard FR4 material shows a thermal load of 178%. A high-frequency laminate which also meets the criterion of dimensional stability (Dupont TK1810018R) has a load value of 157%, i.e. sufficiently more than Roger 3003.

However, Table 1050 indicates that the mechanical load can be significantly reduced when the other commercially available high frequency dielectric (Dupont TK1810018R) is used in combination with a thermomechanical buffer ("second layer") having a sufficiently small CTE value in the xy plane (i.e. the horizontal plane according to FIG. 1), in particular when the value of the Young modulus is not too small. Hence, when the other commercially available high frequency dielectric (Dupont TK1810018R) is maintained and the material parameters of the material layer beneath the high-frequency laminate are modified, it can be seen that the mechanical load is reduced when the CTE value becomes smaller. The reduction of the load is also dependent on the stiffness (elasticity module) of the second layer. The smaller the stiffness of the second layer (when the CTE value remains constant), the smaller is the mechanical buffer effect.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A chip carrier for carrying an encapsulated electronic chip, the chip carrier comprising:
    a laminate structure formed as a stack of a plurality of electrically insulating structures and a plurality of electrically conductive structures;
    a chip coupling area at an exposed surface of the laminate structure being configured for electrically and mechanically coupling the encapsulated electronic chip;
    wherein one of the electrically insulating structures is configured as high frequency dielectric made of a high frequency dielectric material compatible with low-loss transmission of a high-frequency signal;
    wherein at least one of another one of the electrically insulating structures and one of the electrically conductive structures is a thermomechanical buffer configured for buffering thermally induced mechanical load and made of a thermomechanical buffer material,
    wherein the high frequency dielectric is located closer to the chip coupling area than all other of the electrically insulating structures;
    wherein a material below the thermomechanical buffer has a higher coefficient of thermal expansion than the thermomechanical buffer and a material above the thermomechanical buffer has a lower coefficient of thermal expansion than the thermomechanical buffer;
    wherein the thermomechanical buffer material having a value of a Young modulus, in particular within a plane being perpendicular with regard to a stacking direction of the electrically conductive structures and the electrically insulating structures, in a range between 23 GPa and 40 GPa, in a temperature range between 300 K and 400 K.

2. The chip carrier according to claim 1, wherein the thermomechanical buffer material has the low thermal expansion coefficient, in particular the low thermal expansion coefficient within the plane being perpendicular with regard to the stacking direction of the electrically conductive structures and the electrically insulating structures.

3. The chip carrier according to claim 1, wherein the thermomechanical buffer material has the lower thermal expansion coefficient, in particular the lower thermal expansion coefficient within the plane being perpendicular with regard to the stacking direction of the electrically conductive structures and the electrically insulating structures, than the remaining electrically conductive structures.

4. The chip carrier according to claim 1, wherein the thermomechanical buffer material has a linear thermal expansion coefficient, in particular within the plane being perpendicular with regard to the stacking direction of the electrically conductive structures and the electrically insulating structures, in a range between 1 ppm/K and 9 ppm/K, in particular in a range between 3 ppm/K and 8 ppm/K, in a temperature range between 300 K and 400 K.

5. The chip carrier according to claim 1, wherein the thermomechanical buffer is located closer to the high frequency dielectric than all remaining of the electrically insulating structures.

6. The chip carrier according to claim 1, wherein all remaining of the electrically insulating structures are made of FR-4 or prepreg.

7. The chip carrier according to claim 1, wherein at least one of the group consisting of at least a part of the plurality of electrically insulating structures and at least a part of the plurality of electrically conductive structures is configured as at least one layer.

8. The chip carrier according to claim 1, configured as a printed circuit board.

9. An electronic arrangement, the arrangement comprising:
    the encapsulated electronic chip;
    the chip carrier according to claim 1 carrying the encapsulated electronic chip on the chip coupling area.

10. The arrangement according to claim 9, wherein the at least one electronic chip is configured as a high-frequency electronic chip, in particularly at least one of the group consisting of a radar control chip, an emitter chip for emitting a high-frequency signal to an antenna structure, and a receiver chip for receiving a high-frequency signal from an antenna structure.

11. The arrangement according to claim 9, wherein the encapsulated electronic chip comprises an encapsulation structure encapsulating at least part of the electronic chip.

12. The arrangement according to claim 9, wherein the encapsulated electronic chip comprises an electrically conductive coupling structure, in particular a redistribution layer, for electrically coupling the electronic chip to the chip coupling area of the chip carrier.

13. The arrangement according to claim 9, wherein the encapsulated electronic chip is configured as an embedded Wafer Level Ball Grid Array package.

14. The arrangement according to claim 9, wherein a value of the thermal expansion coefficient, in particular within the plane being perpendicular with regard to the stacking direction of the electrically conductive structures and the electrically insulating structures, of the thermomechanical buffer is larger than that of the encapsulated electronic chip, in particular than that of at least one of the group consisting of the electronic chip and its encapsulant.

15. The arrangement according to claim 9, wherein the encapsulated electronic chip comprises at least one solder dot configured for providing a solder connection with the chip coupling area.

16. A method of manufacturing a chip carrier for carrying an encapsulated electronic chip, the method comprising:
    forming a laminate structure as a stack of a plurality of electrically insulating structures and a plurality of electrically conductive structures;
    configuring a chip coupling area at an exposed surface of the laminate structure for electrically and mechanically coupling the encapsulated electronic chip;

configuring one of the electrically insulating structures as high frequency dielectric made of a high frequency dielectric material being compatible with low-loss transmission of a high-frequency signal;

configuring at least one of the group consisting of another one of the electrically insulating structures and one of the electrically conductive structures as a thermomechanical buffer for buffering thermally induced mechanical load;

wherein the high frequency dielectric is located closer to the chip coupling area than all other of the electrically insulating structures;

wherein a material below the thermomechanical buffer has a higher coefficient of thermal expansion than the thermomechanical buffer and a material above the thermomechanical buffer has a lower coefficient of thermal expansion than the thermomechanical buffer;

wherein the thermomechanical buffer material having a value of a Young modulus, in particular within a plane being perpendicular with regard to a stacking direction of the electrically conductive structures and the electrically insulating structures, in a range between 23 GPa and 40 GPa, in a temperature range between 300 K and 400 K.

17. The method according to claim 16, wherein the method further comprises mounting the encapsulated electronic chip at the chip coupling area for electrically and mechanically coupling the encapsulated electronic chip to the chip carrier.

18. The method according to claim 16, wherein the method further comprises forming the laminate structure by pressing the plurality of electrically insulating structures and the plurality of electrically conductive structures together.

* * * * *